United States Patent [19]

Roach et al.

[11] 4,308,337

[45] Dec. 29, 1981

[54] UNIFORM LIGHT EXPOSURE OF POSITIVE PHOTORESIST FOR REPLICATING SPIRAL GROOVE IN PLASTIC SUBSTRATE

[75] Inventors: William R. Roach, Rocky Hill; Dietrich Meyerhofer, Princeton, both of N.J.

[73] Assignee: RCA Corporation, New York, N.Y.

[21] Appl. No.: 128,871

[22] Filed: Mar. 10, 1980

[51] Int. Cl.³ .................... G01D 15/34; G03C 5/00; G11B 7/00; H04N 5/76

[52] U.S. Cl. ........................................ 430/296; 430/5; 430/18; 430/320; 430/321; 430/327; 430/328; 430/329; 358/128.5; 358/129; 346/137; 369/277

[58] Field of Search .................. 430/5, 24, 320, 321, 430/325, 326, 327, 328, 329, 189, 197; 358/6, 7, 128.5, 128.6, 129, 130; 179/100.3 R, 100.3 A, 100.3 G, 100.31 C, 100.3 V

[56] References Cited

U.S. PATENT DOCUMENTS

| | | | |
|---|---|---|---|
| 3,144,331 | 8/1964 | Thommes | 430/327 |
| 3,842,194 | 10/1974 | Clemens | 178/6.6 A |
| 3,888,672 | 6/1975 | Lee | 430/328 |
| 3,943,302 | 3/1976 | Johnston | 1798/100.3 A |
| 3,950,173 | 4/1976 | Ross et al. | 430/197 |
| 4,007,047 | 2/1977 | Kaplan | 430/328 |
| 4,082,453 | 4/1978 | Knop | 430/320 |
| 4,104,832 | 8/1978 | Keizer | 51/281 R |
| 4,150,398 | 4/1979 | Kojima et al. | 430/326 |
| 4,162,510 | 7/1979 | Keizer | 358/128 |
| 4,212,935 | 7/1980 | Canavello et al. | 430/32 C |

OTHER PUBLICATIONS

Ryan, *RCA Review*, vol. 39, pp. 87–115, 3/1978.
Firester et al., *RCA Review*, vol. 39, pp. 427–471, 9/1978.

*Primary Examiner*—Charles L. Bowers, Jr.
*Attorney, Agent, or Firm*—Birgit E. Morris; Allen Bloom

[57] ABSTRACT

An improved method for replicating a spiral groove pattern. The pattern is recorded in a photoresist layer which is then developed to reproduce the pattern in the photoresist layer. The pattern is transferred to a metal layer and formed in the surface of a plastic substrate. The improvement comprises the additional steps of uniformly irradiating the photoresist layer and removing the irradiated photoresist surface layer.

9 Claims, 4 Drawing Figures

UNIFORM LIGHT EXPOSURE OF POSITIVE PHOTORESIST FOR REPLICATING SPIRAL GROOVE IN PLASTIC SUBSTRATE

This invention relates to a method of preparing deep-grooved discs for stylus lapping. More particularly, this invention relates to a method of preparing keel lapping discs by flood exposing the photoresist master used in their fabrication.

RELATED COPENDING APPLICATIONS

This application is related to the copending application of Roach et al., Serial No. 128,870, entitled "Method for Preparing Stylus Lapping Discs having Uniform Groove Depth," which is being filed concurrently herewith.

BACKGROUND OF THE INVENTION

U.S. Pat. No. 3,842,194 of Clemens discloses a video disc having a playback system utilizing variable capacitance. In one configuration of the Clemens system information representative of recorded picture and sound is encoded in the form of a relief pattern in a relatively fine spiral groove on the surface of a disc record. For example, groove widths of about 2.7 micrometers and groove depths of about 0.5 micrometer may be used. During playback, a pickup stylus about 2.0 micrometers wide having a thin conductive electrode thereon, for example, about 0.2 micrometer thick, engages the groove as the record is rotated by a supportive turntable. Capacitive variations between the stylus electrode and the record surface are sensed to recover the prerecorded information.

Keizer, U.S. Pat. No. 4,162,510, which is incorporated herein by reference, discloses a playback stylus which may be used with the Clemens system. The keel tipped pickup stylus comprises a dielectric support element having a body, a constricted terminal portion and shoulders interconnecting the body with the constricted terminal portion.

The constricted terminal portion is defined by a prow, a substantially flat rear surface remote from said prow, side surfaces extending from the side edges of the rear surface, a bottom surface, which preferentially conforms to the groove shape, extending from the bottom edge of the rear surface and a plurality of additional surfaces extending from the prow and intersecting the bottom and the side surfaces. The maximum separation between the substantially parallel side surfaces is less than the given groove width.

A method for manufacturing the keel tipped stylus is disclosed by Keizer in U.S. Pat. No. 4,104,832 also incorporated herein by reference. A tapered dielectric support element, made from a hard dielectric material such as diamond or sapphire, is contacted with an abrasive lapping disc having a deep, trapezoidal coarse pitched groove. The lands on the lapping disc lap the shoulders of the keel tipped stylus and the walls of the abrasive groove form the substantially parallel side surfaces of the constricted terminal portion.

Abrasive discs can be generated by a method described by Ryan, "Material and Process Development for Video Disc Replication," *RCA Review*, Vol. 39, pages 87–115 (1978). A master recording is preferably made in photoresist by optical recording techniques, although other recording methods such as electron beam or electromechanical may also be employed. A metal matrix master, which is a negative replica of the surface of the photoresist master recording, is prepared from the master recording. A metal matrix mold, which is a positive replica of the master recording, is prepared from the matrix master. A metal stamper is then prepared from the matrix mold. The stamper is a negative of the master recording and is used to reproduce the appropriate groove pattern in the surface of plastic discs, which are then coated with an abrasive.

The copending application of Carroll et al. Ser. No. 118,088, filed Feb. 4, 1980, entitled "Method for Preparing Stylus Lapping Discs" disclosed a method of replicating a spiral groove pattern wherein a metal article generated during the replication process has the junctions between its surfaces filled in so that concave junctions result. Playback styli having improved lifetimes result when lapping discs fabricated by the Carroll et al. method are used. Also, metal parts generated during the replication process separate more easily.

Another problem has been encountered during the replication process. It is sometimes difficult to obtain a metal part which reproduces the pattern recorded in the photo-resist master.

SUMMARY OF THE INVENTION

We have discovered an improved method for replicating a spiral groove pattern. The pattern is recorded in a photoresist layer which is then developed to reproduce the pattern in the photoresist layer. The pattern is transferred to a metal layer and formed in the surface of a plastic substrate. The improvement comprises the additional steps of uniformly irradiating the photoresist layer and removing the irradiated photoresist surface layer.

DETAILED DESCRIPTION OF THE INVENTION

A convenient method of recording a spiral groove pattern is by means of optical recording techniques employing a photoresist layer. Other means such as electromechanical cutting or electron beam recording could also be utilized. A discussion of optical recording techniques may be found in an article by A. H. Firester et al. entitled "Optical Recording Techniques for the RCA Video Disc," *RCA Review*, Vol. 39, No. 3, pages 427–471 (1978).

A useful class of positive working photoresists employs an orthoquinone diazo derivative of naphthalene along with an alkali soluble resin such as novolak resins, cellulose derivatives, homopolymers and copolymers of vinyl acetate and the like. Suitable photoresists include Shipley AZ1350, available from the Shipley Co., and a photoresist comprising a mixture of 2,4-bis(6-diazo-5,6-dihydro-5-oxo-1-naphthylenesulfonyloxy)-benzophenone and an alkali soluble novolak resin prepared from cresol and formaldehyde, as described in Ross, U.S. Pat. No. 3,950,173 and incorporated herein by reference.

Any smooth substrate to which the photoresist adheres can be used. A particularly useful substrate is a bright copper layer electroplated upon a smoothly machined, flat aluminum disc. The copper layer is first given a fine machine finish. The photoresist solution is then applied to the substrate in order to produce a solvent-free layer, typically about 3-5 micrometers thick, which is uniform and pin-hole free. A convenient way of applying the photoresist solution is by spin coating. The photoresist layer may then be baked to remove any residual solvent.

The desired spiral groove pattern can be recorded by exposing the photoresist layer to a laser optical recording system. Following exposure, the photoresist layer is flood exposed with light so that the surface layer of the photoresist becomes soluble in the solvent developer. Alternatively, the photoresist may be flood exposed prior to recording the groove pattern.

Figure 1:
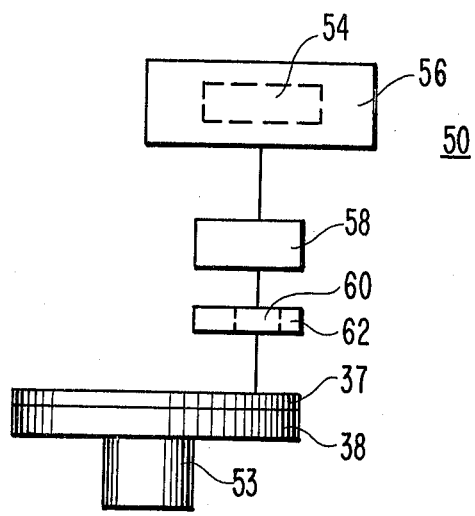
FIG. 1 is a schematic diagram of a flood exposure apparatus.

One method of flood exposing the photoresist employs the flood exposure apparatus 50 shown schematically in FIG. 1. The substrate 38 covered with the photoresist layer 37 is placed on a turntable 53. A lamp 54, such as a mercury or xenon arc lamp, is mounted in a housing 56. The exposure onto the photoresist layer 37 is controlled by means of a shutter 58. A wedge shaped opening 60 in a blocking plate 62 can be conveniently used with this flood exposure apparatus 50. The distance between the lamp 54 and the photoresist layer 37 is preferably great enough to uniformly irradiate a sufficiently large region so that the entire disc area which will contain the spiral groove pattern may be exposed at one time. The light source is not limited to a lamp and can be any source of actinic radiation such as a laser which will render the photoresist layer 37 surface soluble in the developer solvent.

Following flood exposure and recording of the spiral groove pattern, the photoresist layer 37 is developed by contacting it with a solvent developer which selectively removes the more soluble photoresist layer portion.

Figure 2:
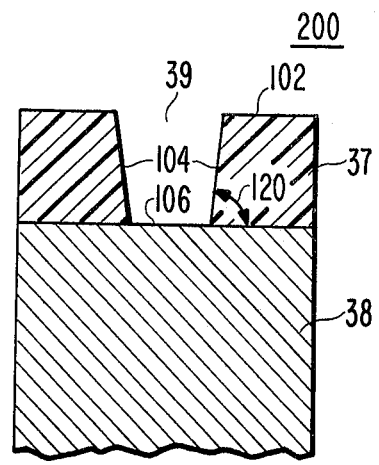
FIG. 2 is a cutaway transverse view of the groove of a photoresist master.

FIG. 2 is a cutaway transverse view of the groove 200 of the photoresist master recording after development. The substrate 38 is covered with a photoresist layer 37 having openings 39 where the more soluble photoresist portion has been removed during development. The groove 200 preferably has well-defined edges between the photoresist top surface 102 and the photoresist walls 204 as well as between the substrate surface 106 and the photoresist walls 104. The angle 120 between photoresist walls 104 and the substrate surface 106 is preferably greater than 90° in order to facilitate separation of the metal parts produced during the replication process. The depth of the groove opening 39 measured between the photoresist top surface 102 and the substrate surface 106 is preferaby 3-5 micrometers, more preferably about 4-5 micrometers if a stylus keel lapping disc is being prepared.

The groove width as measured between the walls 104 of the groove is about 2.0-2.5 micrometers. In order to generate a metal matrix master fabricated, for example, out of nickel or copper, the surface of the photoresist master is coated with a thin layer of a conformal, continuous, conducting metal coating such as gold, nickel or copper. A metal electroform, at least about 0.01 inch (0.025 cm) thick in order to be self-supporting, is then electroplated over the conducting metal layer. The photoresist master is then separated from the metal-coating-faced electroformed metal matrix master and any residual photoresist is removed from the metal matrix master with a solvent such as acetone.

Figure 3:
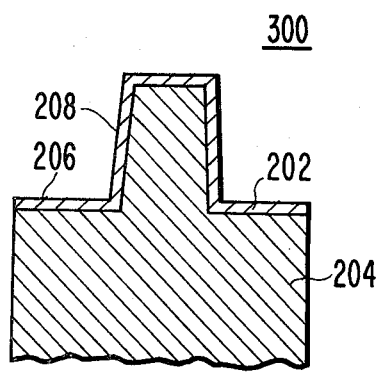
FIG. 3 is a cutaway transverse view of a matrix master made from the photoresist master.

A cutaway transverse view of the metal matrix master 300, is shown in FIG. 3. The metal matrix master is the negative of the photoresist master. The metal matrix 300 comprises a first metal electroform 204 overlying a first metal layer 202. The well-defined edges in the photoresist master should be maintained in the metal matrix master 300. The first metal layer 202 is then passivated so that a second metal electroform will readily and cleanly separate from it.

The second electroform when separated from the first metal layer 202 comprises the matrix mold which is the positive of the photoresist master. A stamper is formed by electroplating the top surface of the mold with a thick, self-supporting third metal electroform. The stamper is used to reproduce the spiral groove pattern in the surface of a plastic disc. The plastic disc may be coated with an abrasive layer such as silicon oxide to produce a lapping disc which can be used to lap a dielectric support element fabricated out of a material such as diamond, sapphire, and the like. For this purpose, a deep (preferably 3-5 micrometers, more preferably 4-5 micrometers), trapezoidally shaped spiral groove disc is preferred.

Figure 4:
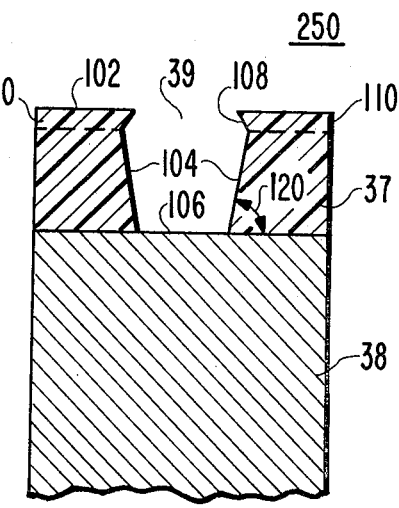
FIG. 4 is a profile cutaway transverse view of a photoresist master not employing this invention.

The present invention solves a problem which arises during the photoresist mastering step which may interfere with the preparation of the metal matrix master 300, the metal mold and the other metal replication parts. During development following laser recording, in the absence of the flood exposure step, some of the developer solvent attacks the unexposed photoresist beneath the surface. This phenomenon is called undercutting. A cutaway transverse view of the groove 250 of the photoresist master 250 is shown in FIG. 4. The photoresist walls 104 and the photoresist top surface 102 join to form a cusp 108. This cusp 108 may interfere with the formation of the first metal layer 202. The cusp 108, for example, may block portions of the photoresist master from being coated if an evaporative coating method is employed. Those portions of the photoresist master which are not coated with the first metal layer 202 will not be replicated during the electroplating step.

In addition, the cusp may be reproduced in the metal matrix master 300. The reproduced cusp may, for example, prevent a clean separation of the second electroform from metal matrix master during the preparation of the metal mold. Attempts to force a separation may result in damage to the metal parts and often cannot be accomplished in a manner which permits completion of the replication process.

The flood exposure step corrects the undercutting by rendering the irradiated photoresist surface layer 110 of the photoresist layer 37 soluble. The irradiated photoresist surface layer 110 is thereby removed with the solvent developer and the cusp is eliminated. The thickness of the irradiated photoresist surface layer 110 to be removed is experimentally determined, being dependent upon the amount of undercutting encountered during development. The thickness of the photoresist layer 37 must also be adjusted so that the groove 200 depth after the irradiated photoresist surface layer 110 is removed is sufficiently deep.

Although a method of carrying out the invention has been described wherein the irradiated photoresist surface layer 110 is removed during development of the photoresist layer after the spiral groove pattern has been recorded, it is to be understood that the invention is not limited thereby. The flood exposure of the photoresist layer 37 and removal of the irradiated surface layer 110 may, for example, occur after the development step. The invention may be carried out at any time before the photoresist layer 37 is coated with a metal layer 202.

The present invention will be further illustrated by the following Example, but it is to be understood that the invention is not meant to be limited to the details described herein.

EXAMPLE

A 28 percent weight to volume photoresist solution was prepared by dissolving 8.5 parts of a crosol-formaldehyde novolak resin (Alnovol 429-K) and 1.5 parts of 2,4,-bis(6-diazo-5,6-dihydro-5-oxo-1-naphthalenesulfonyloxy)benzophenone in 2-methoxyethyl acetate. The solution was spin coated at about 350 rpm onto a 0.5 millimeter thick finish machined bright copper layer which had been electroplated onto a 14 inch (35.6 centimeter) diameter, 0.5 inch (127 centimeter) thick, flat aluminum disc which had been machined smooth. The resulting about 5 micrometer thick photoresist layer was baked in the air for 3 hours at 70° C. to remove any residual solvent.

An RCA model LD2186 20 milliwatt He-Cd gas laser with about a 1 millimeter diameter beam having a wavelength of 441.6 nanometers was used as the recording laser in the laser optical recording system. A spiral track was recorded which was 9 micrometers between adjacent track centers.

After the spiral track was recorded in the photoresist layer 37, the photoresist layer 37 was flood exposed employing the apparatus shown in FIG. 1. An unfiltered 100 watt mercury arc lamp was the light source. A wedge shaped opening 60 in an aluminum blocking plate 62 consisted of two sides which were parallel arcs connected by two straight converging sides which, if extended, could converge at an angle of 30° at the axis of rotation of the substrate 38. The radius of the layer arc, which was generated from the axis of rotation was 15.2 centimeters and that for the smaller arc was 7.6 centimeters. The distance between the arcs was 7.6 centimeters as measured along a straight line to the axis of rotation where both arcs were generated. The distance between the straight sides where they met the larger arc was 8 centimeters. The distance between the straight sides where they met the smaller arc was 4 centimeters. The distance between the blocking plate 62 and the photoresist layer 37 was about 1 inch (2.54 centimeters). A flood exposure of 3 minutes was found to result in about 0.3 micrometer of the top photoresist layer being removed upon development.

Following flood exposure, the photoresist layer 37 was developed in Shipley AZ aqueous alkaline solvent developer for 3 minutes. After development the developed photoresist was baked at 50° C. for one hour and the substrate 38 was allowed to cool to room temperature overnight. The resulting grooves were not cusped and had a slight draft which facilitated ready separation of the metal replication parts.

The photoresist master was coated with a first metal layer 202 which was an evaporated gold layer about 1200 angstroms thick. A continuous, conformal conducting layer resulted. The gold first metal layer was then electroplated with an about 0.011–0.012 inch (0.028–0.030 cm) thick nickel first electroform 204. The first gold layer was then separated from the photoresist master and any residual photoresist was removed using acetone.

The first gold layer 202 was then passivated with an aqueous $K_2Cr_2O_7$ solution (2.5 grams/liter). A second nickel electroform about 0.011–0.012 inch (0.028–0.030 cm) was plated over the passivated first gold layer. The second nickel electroform which was the matrix mold was separated from the first gold layer and passivated.

The matrix mold was electroplated to form a third nickel electroform about 0.01 inch (254 micrometers) thick, which when separated formed the stamper.

The stamper was used to produce vinyl keel lapping discs by compression molding. The discs were coated with a silicon oxide abrasive prepared by the glow discharge deposition from $SiH_4$ and $N_2O$. These keel lapping discs were used to prepare diamond video disc styli. The metal parts used in the replication process readily separated from each other without being damaged.

We claim:
1. In a method for replicating a spiral groove pattern comprising the steps of:
   optical or electron beam recording the pattern in a positive photoresist layer;
   developing the photoresist layer by removing areas of said layer which have been optically or electron beam exposed so that the recorded pattern is reproduced in the photoresist layer;
   transferring the pattern to a metal layer; and
   forming the pattern in the surface of a plastic substrate;
   the improvement which comprises the additional steps prior to transferring the pattern to the metal layer of:
   uniformly irradiating the photoresist surface layer with light for sufficient time so that the surface layer of photoresist becomes soluble in a solvent developer; and
   removing the irradiated photoresist surface layer so that undercutting and formation of a cusp between the photoresist walls and the photoresist top surface are substantially prevented.
2. The method of claim 1 wherein the developing and removing steps are combined.
3. The method of claim 1 wherein the irradiating step occurs prior to the recording step.
4. The method of claim 1 wherein the recording step occurs prior to the irradiating step.
5. The method of claim 1 wherein the spiral groove has a trapezoidal shape.
6. The method of claim 1 wherein the spiral groove is from about 3 to 5 micrometers deep.
7. A plastic disc susbstrate prepared according to claim 1.
8. The disc of claim 7 wherein the plastic is vinyl.
9. The disc of claim 7 wherein the disc is coated with an abrasive layer.

* * * * *